United States Patent [19]
Miyasaka et al.

[11] Patent Number: 5,177,531
[45] Date of Patent: Jan. 5, 1993

[54] ELECTROSTATIC RECORDER AND ELECTROSTATIC LATENT IMAGE MEASURING INSTRUMENT

[75] Inventors: Toru Miyasaka, Hitachi; Takao Umeda, Mito; Tetsuya Nagata, Hitachi; Tatsuo Igawa, Kitaibaraki, all of Japan

[73] Assignee: Hitachi, Ltd., Tokyo, Japan

[21] Appl. No.: 685,195

[22] Filed: Apr. 15, 1991

[30] Foreign Application Priority Data

Apr. 16, 1990 [JP] Japan ................. 2-097667

[51] Int. Cl.⁵ ............................................. G03G 2/00
[52] U.S. Cl. ......................... 355/208; 346/153.1; 355/203; 355/246
[58] Field of Search ............ 355/203, 204, 208, 246, 355/200; 118/666; 346/153.1, 160

[56] References Cited

U.S. PATENT DOCUMENTS

| | | |
|---|---|---|
| 3,944,354 | 3/1976 | Benwood et al. |
| 4,134,137 | 1/1979 | Jacobs et al. ............... 358/293 |
| 4,420,247 | 12/1983 | Suzuki et al. ............... 355/208 |
| 4,572,654 | 2/1986 | Murai et al. ................. 355/214 |
| 4,583,839 | 4/1986 | Suzuki ........................ 355/246 |
| 5,019,862 | 5/1991 | Nakamura et al. ........... 355/208 |

FOREIGN PATENT DOCUMENTS

| | | |
|---|---|---|
| 0338962 | 10/1989 | European Pat. Off. |
| 89/08283 | 8/1989 | PCT Int'l Appl. |

OTHER PUBLICATIONS

Patent Abstracts of Japan vol. 6, No. 255 (P-162 Dec. 14, 1982 & JP-1-57 151 957 (Canon K.K.) Sep. 20, 1982 Abstract.

Patent Abstracts of Japan, vol. 10, No. 132 (P-456) [2189], May 16, 1986; & JP-A-60 254 061 (Rixho K.K.) Dec. 14, 1985 Abstract Partial European Search Report EP 91 10 5810.

*Primary Examiner*—A. T. Grimley
*Assistant Examiner*—P. J. Stanzione
*Attorney, Agent, or Firm*—Antonelli, Terry Stout & Kraus

[57] ABSTRACT

An electrostatic recorder including an electrostatic latent image measuring instrument for measuring a state of an electrostatic latent image formed on a photosensitive substance, and executed a printing process until an electrostatic latent image formed on a surface of a photosensitive substance based on measured data is transferred onto a blank form as a visual image by a transfer device by adjusting control factors such as exposure, exposure time, electrostatic charge voltage, development bias, temperature and humidity. The electrostatic latent image measuring instrument is provided with distance sensors which, when a measuring electrode is disposed near to the photosensitive substance, maintains a constant distance therebetween. It is thus possible to measure an electrostatic latent image even if the photosensitive substance is eccentric. Furthermore, an arc between the measuring electrode and the photosensitive substance is prevented by utilizing a gas having a high arc starting voltage between the measuring electrode and the photosensitive substance of the electrostatic latent image measuring instrument.

24 Claims, 13 Drawing Sheets

EXPOSURE AND EXPOSURE TIME ARE LITTLE

EXPOSURE AND EXPOSURE TIME ARE APPROPRIATE

EXPOSURE AND EXPOSURE TIME ARE MUCH

ELECTROSTATIC RECORDER AND ELECTROSTATIC LATENT IMAGE MEASURING INSTRUMENT

BACKGROUND OF THE INVENTION

The present invention relates to an electrostatic recorder provided with an electrostatic latent image measuring instrument, and, more particularly, to an electrostatic recorder controlled in accordance with results of measurement of an electrostatic latent image, and an electrostatic latent image measuring instrument capable of directly measuring an electrostatic latent image formed on a photosensitive substance.

There is no conventional electrostatic recorders having electrostatic latent image measuring means mounted thereon. In general, the exposure, the development bias and the like have been determined at predetermined design values having sufficient allowance, and the fine adjustment has been made by an operator for every device. It is known that an electrostatic recorder controls an electrostatic charge system, an exposure system and a development system by a fatigue correction program based on the number of printed sheets as fatigue correction of a photosensitive substance (JP-A-62-27390). It is also known that an electrostatic recorder determines the life of a photosensitive substance with the number of printed sheets and the like (JP-A-62-505).

Additionally, ion motion type, a DC amplification type, a revolving sector type, an electro-optical effect type, and an electric power type have been proposed (Kazutoshi Asano: Electric Field and Potential Measuring Method in Electrostatic Engineering, Journal of Institute of Electrostatic Engineers, 10, pp. 205-212 (1986)), as a method of measuring an electrostatic latent image. Since an electrostatic latent image on a photosensitive substance has a size of several hundreds to several tens μm, an electrostatic latent image measuring technique having sufficiently high resolution is required to measure the distribution of the electrostatic latent images. In order to improve resolution, the area of a measuring electrode has to be small, and the measuring electrode and the photosensitive substance have to be close to each other. Several reports in which an electrostatic latent image has been measured by using an electrode having a very small measurement area have been proposed. (Mitsuru Matsui: Very Small Area Surface Electrometer, journal of Institute of Electrostatic Engineers, 10, pp. 217-224 (1986)). A report also has proposed a measurement of the electrostatic latent image by the electron microscope with using measuring electrode (G. F. Fritz, D. C. Hoesterey and L. E. Brady: Observation of Xerographic Electrostatic Latent Images with a Scanning Electron Microscope, Appl. Phys. lett. 19, pp. 277-278 (1971)).

Since there has been no means for observing an electrostatic latent image in an electrostatic recorder, it is difficult to carry out the fine adjustment so that the device is suited to individual photosensitive substance, and it is also difficult to fully demonstrate the performance of the photosensitive substance in the case of the conventional electrostatic recorder. Further, it is impossible to accurately determine the life of a photosensitive substance since the electrostatic latent image cannot be observed whether the latent image is present or not.

Furthermore, no consideration has been given so as to measure an electrostatic latent image in an electrostatic recorder in the conventional electrostatic latent image measuring instrument in which the area of a measuring electrode is small. There is eccentricity and the like in a photosensitive drum on an electrostatic recorder, which has made it impossible to have a measuring electrode come close to a photosensitive substance at a very small distance. Moreover, the electric potential of an electrostatic latent image on a photosensitive substance sometimes reaches near 1 KV, thus causing a problem of discharge occurring when the measuring electrode is brought close to the photosensitive substance.

Further, above-mentioned the conventional devices for measuring an electrostatic latent image using the electron microscope are incapable of measuring a latent image on a photosensitive substance of the electrostatic recorder due to special measuring environment.

SUMMARY OF THE INVENTION

It is an object of the present invention to provide an electrostatic recoder capable of carrying out optimum control which is suited to a state of a photosensitive substance.

It is another object of the present invention to provide an electrostatic recorder capable of having a measuring electrode for measuring an electrostatic latent image come close to a photosensitive substance even in case of eccentricity of the photosensitive substance.

It is another object of the present invention to provide an electrostatic recorder capable of preventing an arcing between a measuring electrode and a photosensitive substance.

It is another object of the present invention to provide an electrostatic latent image measuring instrument capable of measuring an electrostatic latent image on a photosensitive substance of an electrostatic recorder.

For above-mentioned purpose of performing optimum control which is suited to a state of a photosensitive substance, means for observing an electrostatic latent image is provided on the electrostatic recorder so as to carry out operation of respective parts and life determination of a photosensitive substance.

Furthermore, in order to achieve above-mentioned object to have a measuring electrode for measuring an electrostatic latent image in case of eccentricity of a photosensitive substance, means are provided for controlling a distance between the measuring electrode having a very small area and the photosensitive substance constant.

Moreover, for above-mentioned purpose of preventing arcing between the measuring electrode and the photosensitive substance, means are provided for setting a common electric potential of a measurement circuit for measuring an electrostatic latent image to a reference power source potential between the highest potential and the lowest potential of the electric potential of a measurement object.

Furthermore, means are provided for filling a gas having a high arc starting potential between the measuring electrode and the photosensitive substance.

It is possible to detect a state of an electrostatic latent image on the photosensitive substance by providing electrostatic latent image measuring means. Since a printing process is controlled so that the latent image becomes optimum, it is possible to carry out appropriate control which is suited to the state of the photosensitive substance. Further, it is also possible to accurately determine the life of the photosensitive substance because the state of the latent image is observed.

It is possible to identify the width of charge pattern formed by an exposure portion and a non-exposure portion and the state of the electrostatic latent image formed with repetitive dotted pattern which repeats on and off for every several dots to several tens dots, and also, the repetitive dotted pattern which repeats on and off for every single dot with each other as an exposure pattern for measuring latent image.

Since exposure, exposure time, development bias and photosensitive substance heating time are controlled based on the state of the electrostatic latent image, it becomes possible to carry out optimum control of the printing process. Further, the life of the photosensitive substance can be detected accurately from determining the state of the electrostatic latent image.

Plural distance measuring means are arranged on concentric circles with the measuring electrode as the center so that the spacing between the plural distance measuring means is constant. Therefore, it is assumed that the photosensitive substance surface is a plane, the distance between the measuring electrode and the photosensitive substance surface is given with a mean value of the distance measuring means.

Further, when the measurement object of a latent image is a photosensitive drum, two distance measuring means are adopted and a line connecting these two distance measuring means and a photosensitive drum axis are parallel to each other, whereby the distance between the photosensitive substance and the measuring electrode is determined with an average of two distance sensors.

It is possible to maintain the distance between the measuring electrode and the photosensitive substance constant by maintaining these mean values constant.

It is possible to prevent discharge when the distance between the photosensitive substance and the measuring electrode becomes narrower by setting the common potential of the latent image measurement circuit to a potential between the highest potential and the lowest potential of the measurement object, to thereby reduce the potential difference between the measuring electrode and the photosensitive substance. Further, the output of the measurement circuit becomes very small when the measuring electrode area is reduced, which causes the output of the measurement circuit unreadable due to ripples and the like of the reference power source. If a battery is used as the reference voltage, however, a stabilized reference voltage is obtainable.

Further, a measuring electrode point is surrounded by a first case having an opening portion in a direction facing the photosensitive substance and a second case having an opening portion in a direction facing the photosensitive substance and surrounding the first case, and it is possible to fill the space between the measuring electrode and the photosensitive substance with a gas having a high arc starting voltage without releasing the gas outside the second case by filling up the first case with the gas having a high arc starting voltage and intaking the gas having a high arc starting voltage in the first case together with outside air with the second case. Further, it is possible to prevent arcing in case the distance between the measuring electrode and the photosensitive substance becomes short by filling with a gas having a high arc starting voltage between the measuring electrode and the photosensitive substance by a technique as described above.

In a charge measurement circuit of a directcurrent amplification type in which electric charge induced in a measuring electrode is converted into voltage with a capacitor for measurement, and measurement of electric charge is performed with impedance conversion, it is assumed that a discharge switch has a two-stage structure of a main discharge switch and a sub-discharge switch. The main discharge switch performs connection and disconnection between the measuring electrode and the common potential. The sub-discharge switch supplies a drive voltage for bringing the main discharge switch into a connected state and the common potential to the main discharge switch at the time of non-measurement (at the time of arcing), and supplies an output obtained by impedance conversion of a measuring electrode potential output through a buffer amplifier to all terminals which are not connected to the measuring electrode of the main discharge switch at the time of measurement. With this, it is possible to eliminate potential difference between potentials applied to measuring electrode side in the main discharge switch and other terminals at the time of measurement, thus making it possible to make the resistance in open circuit of the entire discharge switch apparently very large. As a result, it is possible to make the drift generated because of the fact that leakage current at the time of measurement is accumulated in a capacitor for measurement very small.

Further, the sub-discharge switch is composed of a first sub-discharge switch which is connected at the time of measurement only and a second sub-discharge switch which is connected at the time of non-measurement only, and switching is made from a non-measurement state (arc state) through a state in which both the first sub-discharge switch and the second sub-discharge switch are connected.

Thus, it is possible to set a plunging current generated when the first sub-discharge switch is connected free from the second sub-discharge switch, and it is possible to limit unnecessary current accumulated in a capacitor for measurement when the non-measurement state is changed over to the measurement state to a plunging current only in case the second sub-discharge switch is opened.

Further, it is possible to prevent noises caused by capacity variation between measurement circuit wirings due to external vibration at the time of measurement by holding a measurement circuit in a measurement circuit case with a vibration absorbing member.

DESCRIPTION OF THE PREFERRED EMBODIMENTS

Hereinafter, embodiments of the present invention are described with reference to the drawings, in accordance with an electrostatic latent image measuring instrument and an electrostatic recorder including the electrostatic latent image measuring instrument.

Figure 1A:
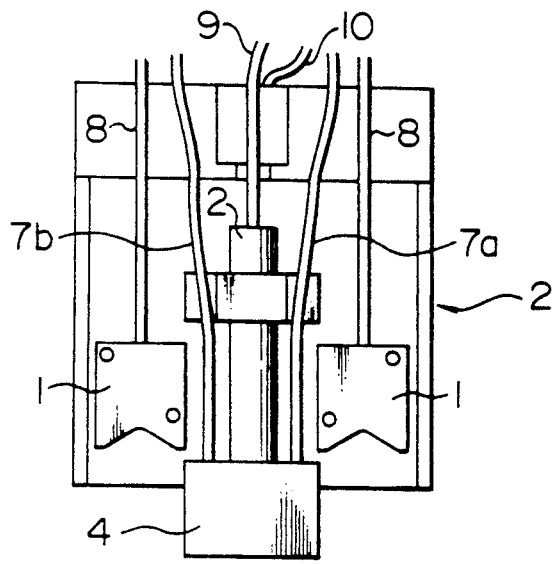
FIG. 1A is a plan view of an arrangement of respective parts of an electrostatic latent image measuring instrument.
Figure 1B:
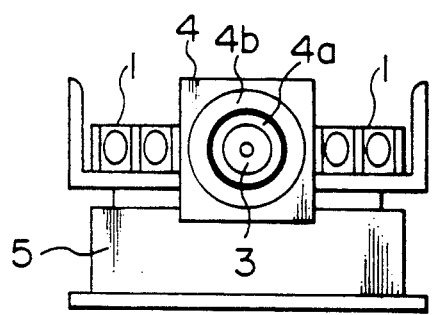
FIG. 1B is an end view of the arrangement of FIG. 1A.
Figure 1C:
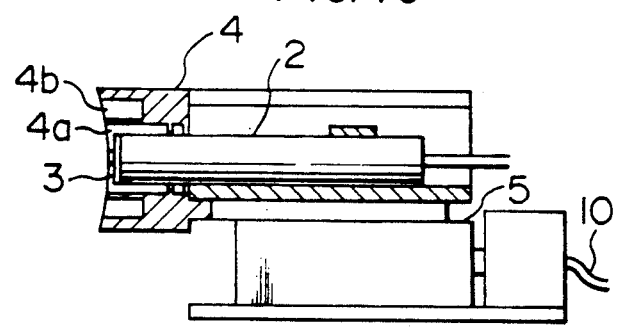
FIG. 1C is a partial cross-sectional view of the arrangement of FIG. 1A.

Referring first to FIGS. 1A, 1B and 1C, an electrostatic latent image measuring instrument has a laser type non-contact distance sensors 1 on both sides of a probe 2, in which a measuring electrode (an electrostatic latent image measuring sensor portion) is provided at a point portion 3 (FIGS. 1B, 1C) of the measurement circuit, and a gas chamber 4, composed of a double case formed of an inner case 4a and an outer case 4b, and surrounding the measuring electrode, is fitted in order to enable a filling with a gas having a high discharge starting voltage in the vicinity of the measuring electrode. An output line 9 from the measurement circuit case 2 is connected to a measurement circuit controller (not shown) or A-D converter (not shown).

The gas chamber 4 which surrounding the probe 2, the laser type non-contact distance sensors 1, and the measuring electrode are fitted onto a precision pulse stage 5 (FIGS. 1B, 1C). Output lines 8 of the laser type sensors 1 are connected to a computer (not shown), and the computer controls the precision pulse stage 5 based on this output so that the distance from a photosensitive substance 6 may be maintained constant. A control line 10 (FIGS. 1A, 1C) from the precision pulse stage 5 is connected to a pulse stage.

Figure 2:
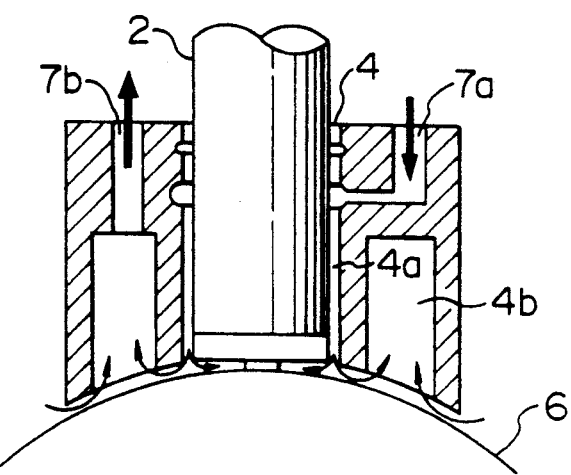
FIG. 2 is a cross-sectional view an inner case and an outer case adapted to be filled with a gas having a high arc starting voltage in the vicinity of a measuring electrode.

FIG. 2 is a view for explaining an embodiment. The gas chamber 4 adapted to be filled with a gas having a high arc starting voltage in the vicinity of the measuring electrode includes passage 7a through which $SF_6$ gas having a high arc starting voltage is supplied via a pressure reducing valve. The gas chamber 4 is formed in the inner case 4a, and a passage 7b is connected to an exhaust pump formed in the outer case 4b. These passages 7a and 7b are connected to the exhaust pump in a form of pipes as shown in FIG. 1A. As apparent from the above description, it is possible to fill the gas chamber 4 with the $SF_6$ gas in the inner case 4a, and also, to recover the $SF_6$ gas so as prevent leakage of the $SF_6$ gas to outside of the outer case 4b. When an electrostatic latent image measuring instrument is used in the electrostatic recorder, adverse influence is exerted on the operation in which discharge of an electric charge device and the like are utilized if the $SF_6$ gas having a high arc starting voltage leaks into the instrument. Therefore, such recovery means of the gas having a high arc starting voltage as described above is required.

Figure 3:
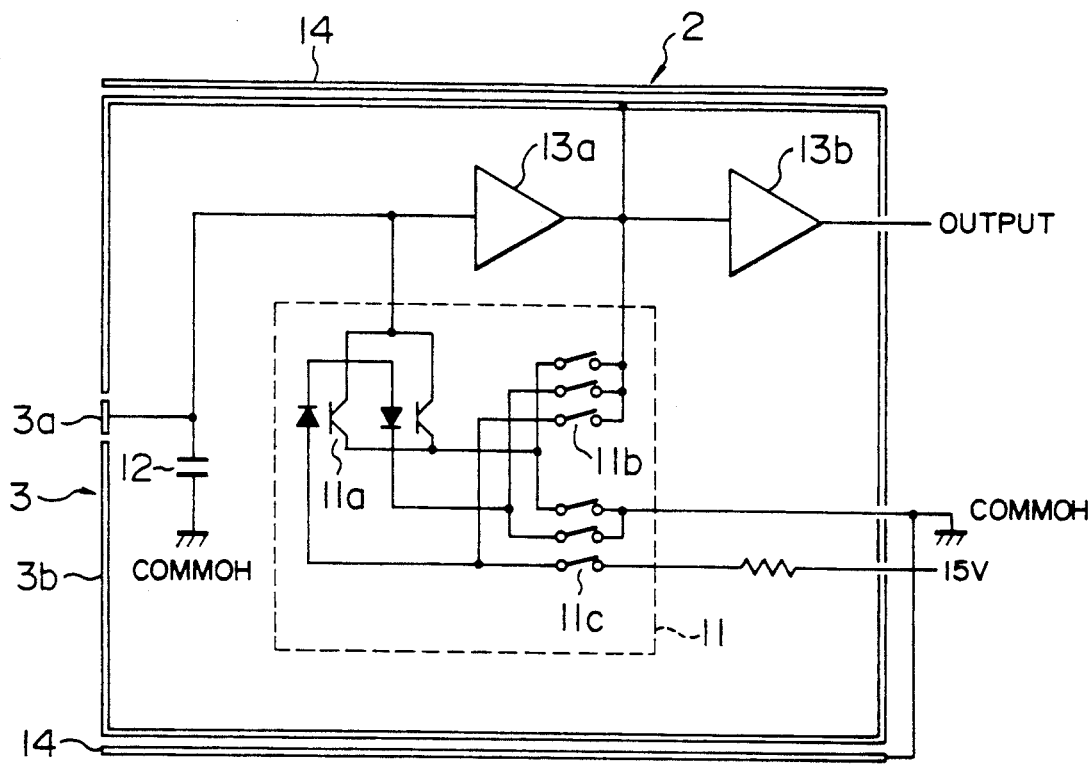
FIG. 3 is a diagram of a measurement circuit of the present invention.

FIG. 3 is a diagram for explaining an embodiment of a measurement circuit in the probe 2. A basic principle of the measurement circuit is to convert electric charges, induced in a measuring electrode 3a by having the measuring electrode 3a come close to the photosensitive substance 6, into voltage by a capacitor 12 for enabling measurement, which measurement is amplified by an amplifier having high input impedance. The output voltage of this amplifier is subject to a large influence even by inflow of a very small current from the outside because of measurement of very small electric charges. Therefore, the amplifier has a two-stage construction of including a buffer amplifier 13a and an amplifier 13b of an amplification factor of twenty (20). The voltage induced in the measuring electrode 3a is applied with impedance conversion of the output voltage in the buffer amplifier 13a (amplifier having an amplification factor 1:1), and this voltage is applied to a shield 14 which surrounds a guard electrode 3b of the measuring electrode 3a, to thereby minimize current inflow from the outside. The output of the buffer amplifier 13a is amplified by the amplifier 13b having an amplification factor of twenty (20), and is outputted outside the probe 2 at the buffer amplifier output. Electric charge with the amplifier 13b at the second stage is performed for the purpose of reducing the influence by external noises when an output signal is sent out of the probe 2, and it is recommended to use an appropriate amplification factor in accordance with the output voltage of the buffer amplifier 13a.

When it is assumed that the potential at the surface of the photosensitive substance 6 is $V_S$ and the electrostatic capacity of the photosensitive substance 6 is $C_P$, an electric quantity $Q_P$ existing on the photosensitive substance 6 is determined by the following relationship:

$$Q_P = V_S \cdot C_P$$

When the measuring electrode 3a is disposed very close to the photosensitive substance 6, a surface potential of the photosensitive substance 6 is lowered. This is due to the fact that the electrostatic capacity on the surface of the photosensitive substance 6 is varied because the measuring electrode 3a is placed very close thereto. Assuming that an electrostatic capacity of a very small gap between the measuring electrode 3a and the photosensitive substance 6 is $C_J$ and an electrostatic capacity of a capacitor 12 for measurement is $C_M$, an electrostatic capacity $C_{PM}$ at the time of measurement is expressed by the following expression:

$$C_{PM} = C_P - \frac{C_J \cdot C_M}{C_J - C_M}$$

The surface potential $V_{SM}$ of the photosensitive substance 6 at the time of measurement when the measuring electrode 3a is very close to the photosensitive substance 6 is expressed by the following equation:

$$V_{SM} = \frac{C_P}{C_{PM}} V_S$$

$$= \left( \frac{C_P(C_J - C_M)}{C_P(C_J - C_M) - C_J \cdot C_M} \right) V_S$$

The detected electrode voltage at this time, namely an input voltage $V_{IN}$ of the buffer amplifier 13a is expressed by the following expression based on the very small gap between the measuring electrode 3a and the photosensitive substance 6 and the electrostatic capacity of the capacitor 12 for measurement.

$$V_{IN} = \frac{C_J}{C_J - C_M} V_{SM}$$

$$= \frac{C_P \cdot C_J}{C_P(C_J - C_M) - C_J \cdot C_M} V_S$$

Figure 4:
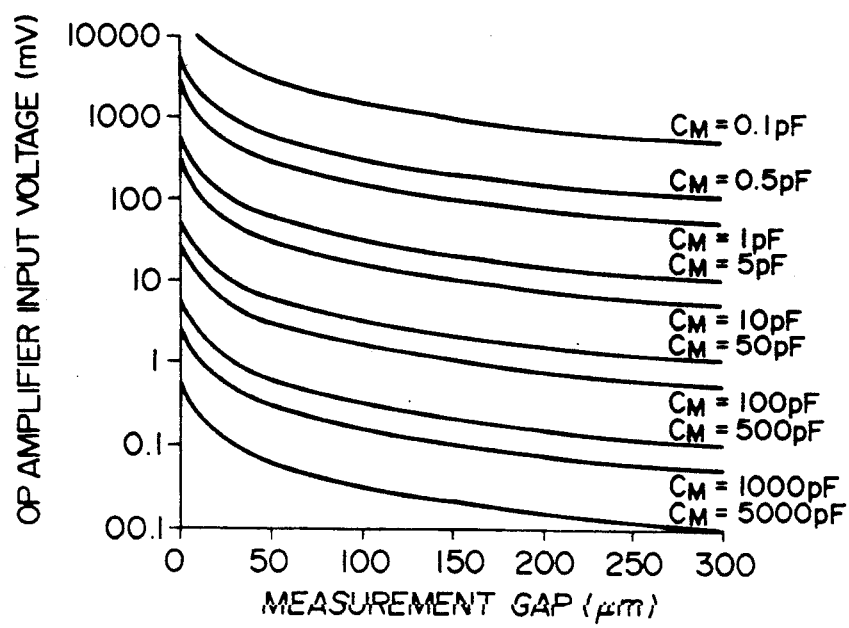
FIG. 4 is graphical illustration depicting results of computing a measuring gap vs. an operational amplifier input voltage on an electrostatic capacity of a capacitor for measurement when photosensitive substance surface potential at the time of measurement is 1 KV.

When the diameter of the measuring electrode 3a is at 50 $\mu$m, the measured area is approximately $1.96 \times 10^{-3}$ mm$^2$. When the photosensitive substance 6 to be measured is an organic photosensitive substance having a thickness of approximately 20 $\mu$m, the dielectric constant of the photosensitive substance 6 is approximately four (4), and the electrostatic capacity $C_P$ of the organic photosensitive substance having the thickness of 20 $\mu$m on the measured area is approximately at $3.5 \times 10^{-15}$ F. Further, when the measurement gap is assumed to be at G ($\mu$m), the electrostatic capacity by the small gap between the measuring electrode 3a and the photosensitive substance 6 will be $C_J = 1.74 \times 10^{-14}/G(F)$. FIG. 4 shows results of computing input voltages of the buffer amplifier 13a against the electrostatic capacity of the measurement gap and the capacitor 12 for measurement when the surface potential of the photosensitive substance 6 is at 1 KV at the time of measurement. In view of the stability of the output against noises and the like, a voltage at approximately 100 mV is required for the input voltage of the buffer amplifier 13a against the surface potential of the photosensitive substance 6 at 1 KV. When it is assumed that the measurement gap is at 50 $\mu$m, the capacitor 12 for measurement of several pFs and below has to be used. The input voltage of the buffer amplifier 13a in case 5 pFs are adopted as the capacitor 12 for measurement becomes approximately 63 mV for the surface potential of the photosensitive substance 6 at 1 KV.

In a circuit system of the present invention, it is necessary to provide a discharge switch 11 for discharging electric charges charged in the capacitor 12 prior to measurement. Attention should be paid to the discharge switch 11 so that electrostatic capacity and leakage current are not generated at the time of measurement. When ordinary analog switch or relay and the like is used as the discharge switch 11, rapid drift caused by a leakage current from a power source line is observed. Furthermore, the electrostatic capacity for measurement becomes large by the electrostatic capacity of the discharge switch 11, which causes sufficient electrode voltage to be unobtainable. Accordingly, the discharge switch 11 is constructed to have two-step structure including a main discharge switch 11a by photocouplers and subdischarge switches 11b and 11c by analog switches so that the output of the buffer amplifier 13 is fed back to all the terminals of photocouplers at the time of measurement.

Figure 5A:
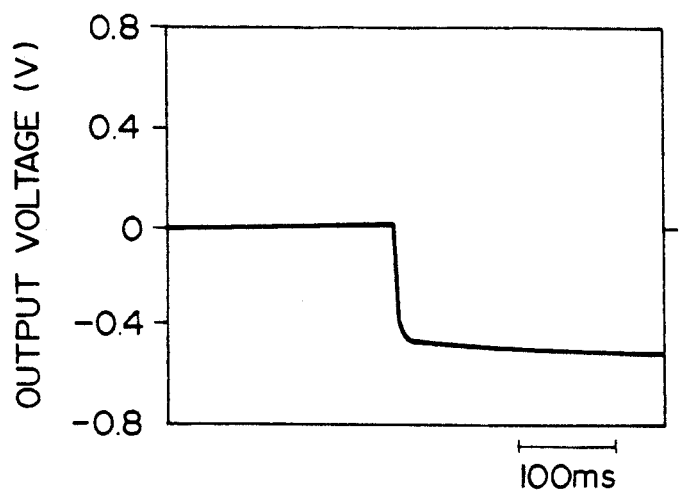
FIG. 5A is a graphical illustration of the result of measuring output variation on an experimental substrate when the non-measurement state (discharge state) is changed over to the measurement state.

FIG. 5A shows results of measuring output variation on an experimental substrate when a non-measurement state (arc state) is changed over to a measurement state in this construction. At the time of mode change-over, sudden output change at approximately 0.5 mV which foreseen to be caused by plunging current from the sub-discharge switch 11b and the subdischarge switch 11c is observed. If such voltage rise occurs at the time of mode changing over, the output is saturated promptly at the time of amplification in the second stage amplifier 13b and sufficient amplification can not be executed.

Figure 5B:
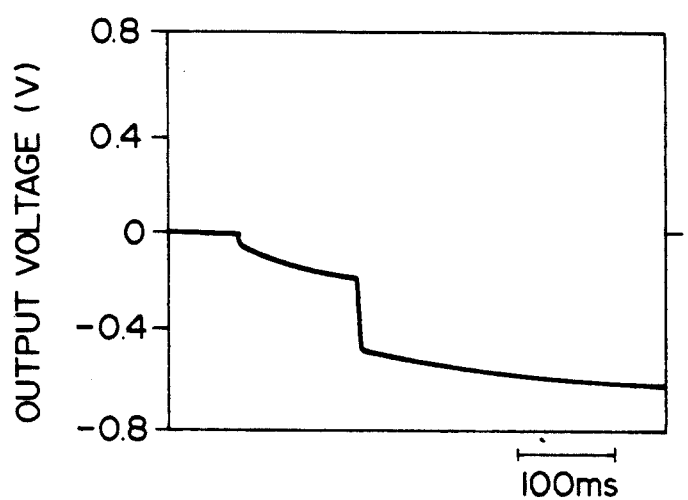
FIG. 5B is a graphical illustration of the result of measurement when the connection timing of the sub-discharge switch 11b is delayed behind the opening of the sub-discharge switch 11c.
Figure 5C:
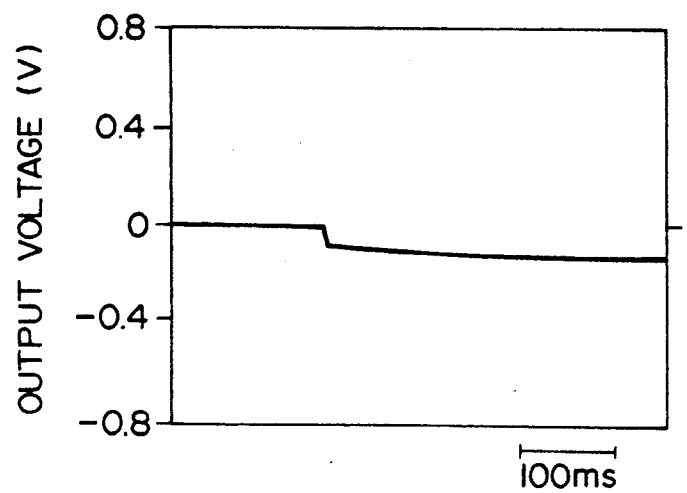
FIG. 5C is a graphical illustration depicting the result when the timing of opening of the sub-discharge switch 11c is delayed behind the timing of connecting the sub-discharge switch 11b.

FIG. 5B shows results of measurement in case the timing of connecting the sub-discharge switch 11b is delayed behind opening of the sub-discharge switch 11c by means of a delay circuit. It will be understood from FIG. 5 that the voltage rise due to the plunging current of the sub-discharge switch 11c is at 0.05 to 0.15 mV, and the plunging current from the sub-discharge switch 11b is at 0.35 to 0.4 mV. FIG. 5C shows the result when the timing of opening of the sub-discharge switch 11c is delayed behind the timing of connecting the sub-discharge switch 11b. As apparent, it is realized that the influence by the plunging current from the sub-discharge switch 11b may be eliminated by having the timing of opening the sub-discharge switch 11c delayed behind connection of the sub-discharge switch 11b. This is due to the fact that the current generated from the sub-discharge switch 11b flows to a common power source in a state that both switches are connected. Accordingly, in the circuit construction of the present embodiment, the sub-discharge switch is divided into the sub-discharge switch 11b which is connected at the time of measurement only and the subdischarge switch 11c which is connected at the time of non-measurement only, and a delay circuit is provided so that both switches are changed over through the connected state when the non-measurement state is changed over to the measurement state.

Figure 6A:
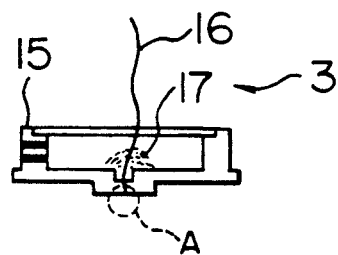
FIG. 6A and FIG. 6B are schematic views of a manufacturing method of a point portion of a measurement circuit with FIG. 6B being an enlarged view of an area A in FIG. 6A.
Figure 6B:
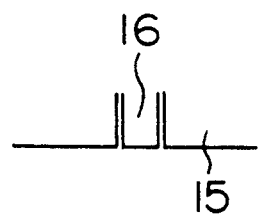

FIG. 6A and FIG. 6B are views for explaining a manufacturing method of a point portion 3 of the probe 2. It is preferable that the point portion 3 of the measuring electrode includes a guard electrode 3b having a sufficient area so that an electrostatic latent image is not disturbed at the time of measurement, or the surface of the photosensitive substance 6 is not damaged when the point portion 3 of the measuring electrode comes into contact with the photosensitive substance 6. The point portion 3 of the measuring electrode having such a large guard electrode 3b may be manufactured as described below.

As to the point portion 3, a fine hole having a diameter, a little larger than the diameter of the measuring electrode 3a, is processed in a base material 15 of the point portion 3 of the measuring electrode. An electric discharge machine and the like may be used for the processing. Next, a very fine wire 16 with an insulated resin coating surface is inserted in the fine hole, and bonding is performed thereafter with epoxy resin 17 and the like. After cutting, the inserted very fine wire 16 at the surface of the measuring electrode 3a, flattening is applied to the surface of the measuring electrode 3a with a lathe or a milling machine and grinding is applied thereto, to thereby smooth the surface of the measuring electrode 3a. With this, it is possible to manufacture the point portion 3 of the measuring electrode having a sufficiently large area of the guard electrode 3b.

Figure 7:
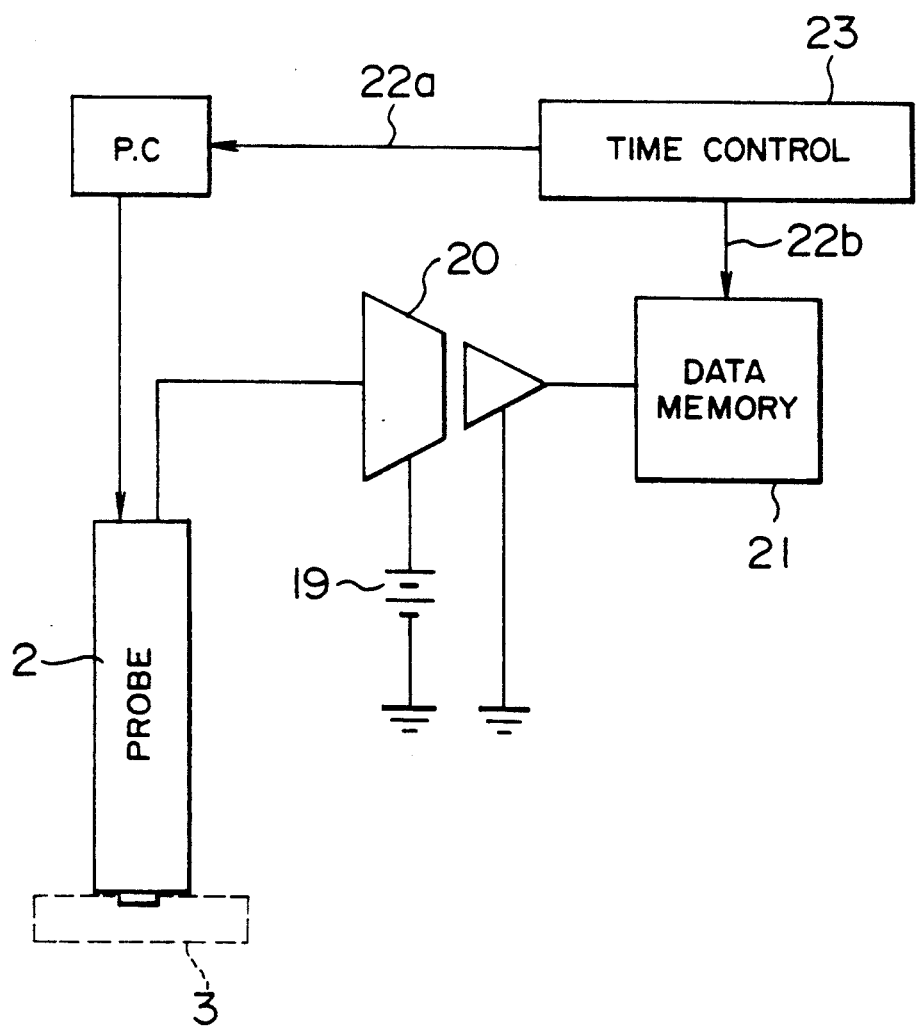
FIG. 7 is a schematic view of components of an external portion of a circuit case.

As shown in FIG. 7, a common potential of the probe 2 is applied to a reference potential power source 19 at an intermediate potential between the highest voltage and the lowest voltage of the photosensitive substance 6, and a measurement signal is applied to a data storage means 21 through an insulation amplifier 20. The data storage means 21 stores measurement data for a certain time interval setting to a timing signal from a timing control unit 23. Further, a photocoupler p.c. receives a discharge switch control signal 22a from a timing control unit 23, and transmits this timing signal 22a to the probe 2. The probe 2 executes measurement operation on the electrostatic latent image based on the timing signal 22a.

The reason why the common potential of the probe 2 is set at an intermediate potential between the maximum voltage and the minimum voltage of the photosensitive substance 6 is to minimize the electric field intensity between the photosensitive substance 6 and the measuring electrode 3, thereby making it possible to prevent an arcing between the measuring electrode 3a and the photosensitive substance 6.

A reference potential power source 19 providing to have the common potential requires to have a very small power source ripple. Therefore, a higher voltage battery and the like may be used.

As to a arc preventive measure using $SF_6$ gas having a high arc starting voltage and a spark preventive measure by application of bias with a reference power source, either one of them or none of them may be used in some cases in accordance with the electric field intensity generated between the measuring electrode 3a and the photosensitive substance 6.

Figure 8:
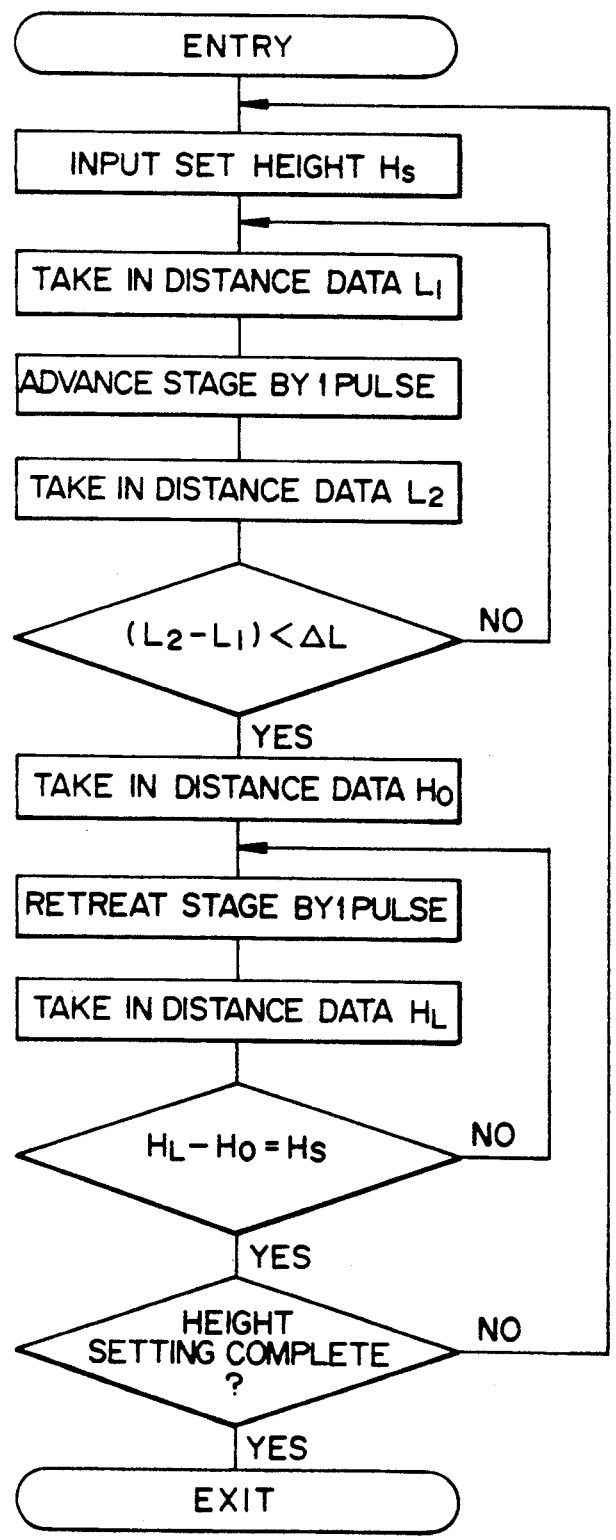
FIG. 8 is a flow chart of a control program of a precision pulse stage by a distance sensor output, in which a contact position between a measuring electrode and a photosensitive substance is detected.

FIG. 8 is a flow chart for explaining a technique for detecting a contact position between the measuring electrode 3a and the photosensitive substance 6, and a control program for controlling the precision pulse stage 5 by the outputs of the distance sensors 1.

First, a set distance $H_S$ between the measuring electrode 3a and the photosensitive substance 6 is inputted. Next, distance data $L_1$ are taken in as a mean value of distances which the distance sensor 1 can measure. Next, the precision pulse stage 5, equipped with the electrostatic latent image measuring instrument 4c, is advanced by a very short distance for example, a portion corresponding to one pulse for advancing the precision pulse stage 5, toward the photosensitive substance 6. Distance data $L_2$ are taken in from the distance sensor 1. Next, the difference of these distance data $(L_2 - L_1)$ is computed, and if this value is found to be smaller less than a predetermined value $\Delta L$, the distance data at that time are stored in a data storage means 21 as a position $H_O$ of the photosensitive substance 6 assuming that the output value of the distance sensors 1 at that time is the distance between the measuring electrode 3a and the photosensitive substance 6. With the difference between distance data $(L_2 - L_1)$ being greater than the predetermined value $\Delta L$, the precision pulse stage 5 is advanced toward the photosensitive substance 6 by replacing $L_2$ with $L_1$, and above-mentioned operation is repeated.

After the contact position between the measuring electrode 3a and the photosensitive substance 6 is measured, the precision pulse stage 5 is withdrawn. A distance H between the measuring electrode 3a and the photosensitive substance 6 may be computed as $H = H_L - H_O$ from the distance data $H_L$ by the distance sensor 1.

This operation utilizes a fact that the precision pulse stage 5 stops to advance even if a pulse is applied to the precision pulse stage 5 when the measuring electrode 3a and the photosensitive substance 6 come into contact with each other. When respective parts of the electrostatic latent image measuring instrument 4c, the photosensitive substance 6 is deformed by an advancing operation of the precision pulse stage 5; however, accurate measurement can no longer be made. Accordingly, the driving voltage of the precision pulse stage 5, in case of distance setting, is smaller than usual such as the time of distance control, to thereby reduce the driving force and make deformation of respective parts at the time of contact between the measuring electrode 3a and the photosensitive substance 6 as small as possible. The above-mentioned value $\Delta L$ for the contact determination may be experimentally determined considering such very small deformation.

Figure 9:
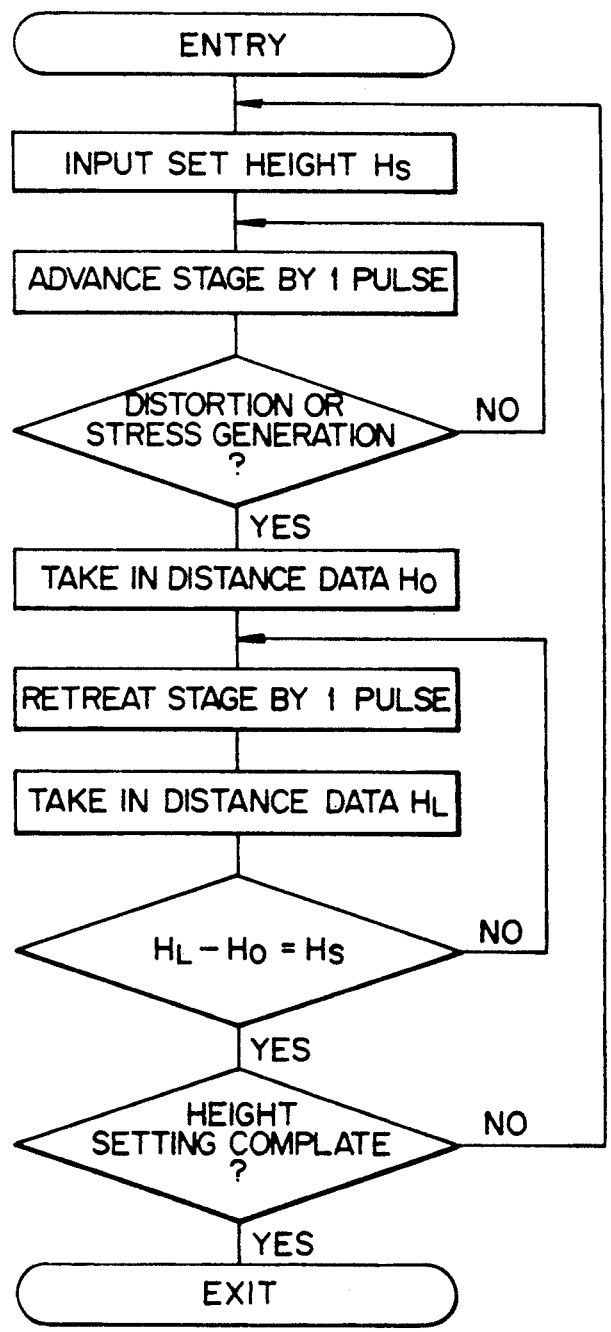
FIG. 9 is a flow chart of a program controlling a precision pulse stage by detecting a contact position between a measuring electrode and a photosensitive substance.

FIG. 9 is a chart for explaining another embodiment for detecting the contact position between the measuring electrode 3a and the photosensitive substance 6, and is also a chart for explaining the flow of a control program of the precision pulse stage 5.

A stress sensor or a distortion sensor is provided at such a position that a distortion may be generated when the measuring electrode 3a of the electrostatic latent image measuring instrument 4c comes into contact with the photosensitive substance 6. The precision pulse stage 5 advances while monitoring the output variation of this sensor, and distance data of the distance sensors 1 at a position where the distortion caused by the contact between the measuring electrode 3a and the photosensitive substance 6 is detected are stored in the data storage means 21 as the position $H_O$ of the photosensitive substance 6.

After the contact position between the measuring electrode 3a and the photosensitive substance 6 is measured, the precision pulse stage 5 is. The distance H between the measuring electrode 3a and the photosensitive substance 6 may be computed as $H = H_L - H_O$ from the distance data $H_L$ of the distance sensors 1.

Figure 10A:
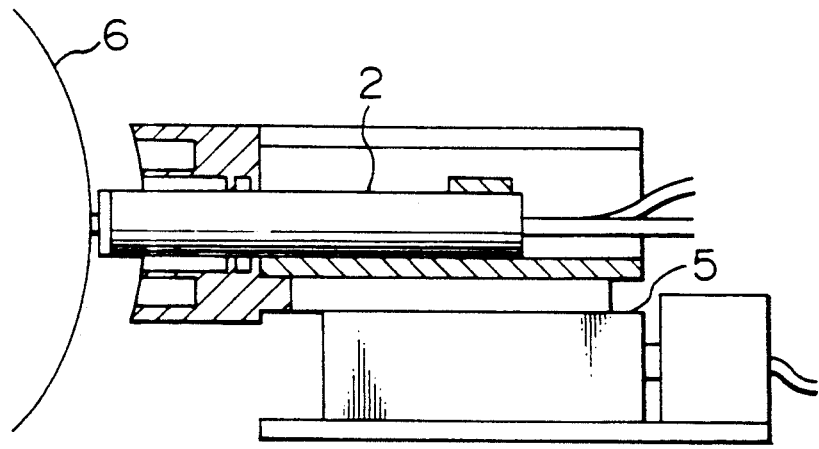
FIG. 10A, FIG. 10B and FIG. 10C are partial cross-sectional views showing states of detecting contact positions between a measuring electrode and a photosensitive substance.
Figure 10B:
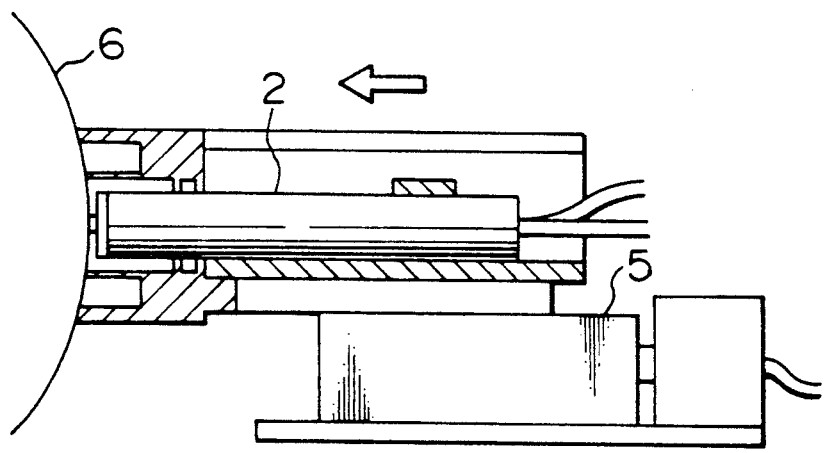
Figure 10C:
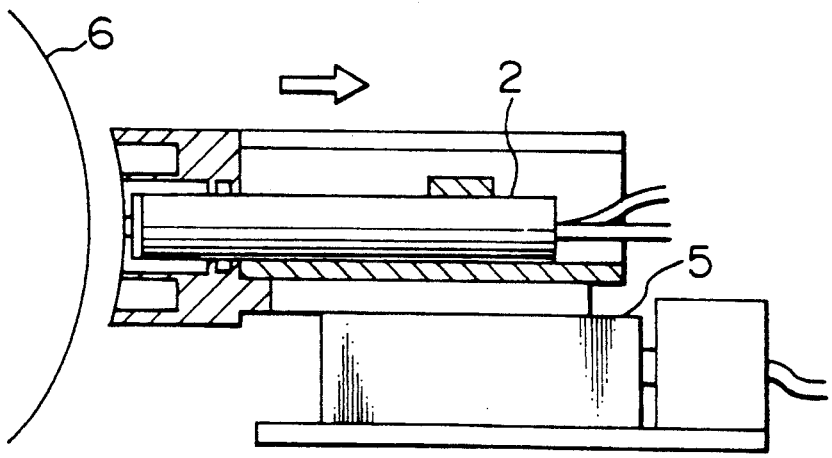

FIG. 10A, FIG. 10B and FIG. 10C are views for explaining the operation for detecting the contact position between the measuring electrode 3a and the photosensitive substance 6.

The probe 2 is fitted to the precision pulse stage 5 in such a manner that the probe 2 is slidable in the stage movement direction. In FIG. 10A, the probe 2 and the photosensitive substance 6 contact each other at a position where the precision pulse stage 5 has been withdrawn. In FIG. 10B, the precision pulse stage 5 slowly advances toward the photosensitive substance 6 side up to the predetermined distance data position $H_O$ of the distance sensors 1 so as to push the probe 2 against the photosensitive substance 6. In FIG. 10C, the contact position between the measuring electrode 3a and the photosensitive substance 6 reaches the predetermined distance data position $H_O$ of the distance sensors 1 by thereafter withdrawing the precision pulse stage 5. Since the fixing strength of the probe 2 is of importance at this time, the fixing strength of the probe 2 is arranged to be easily changed.

Figure 11:
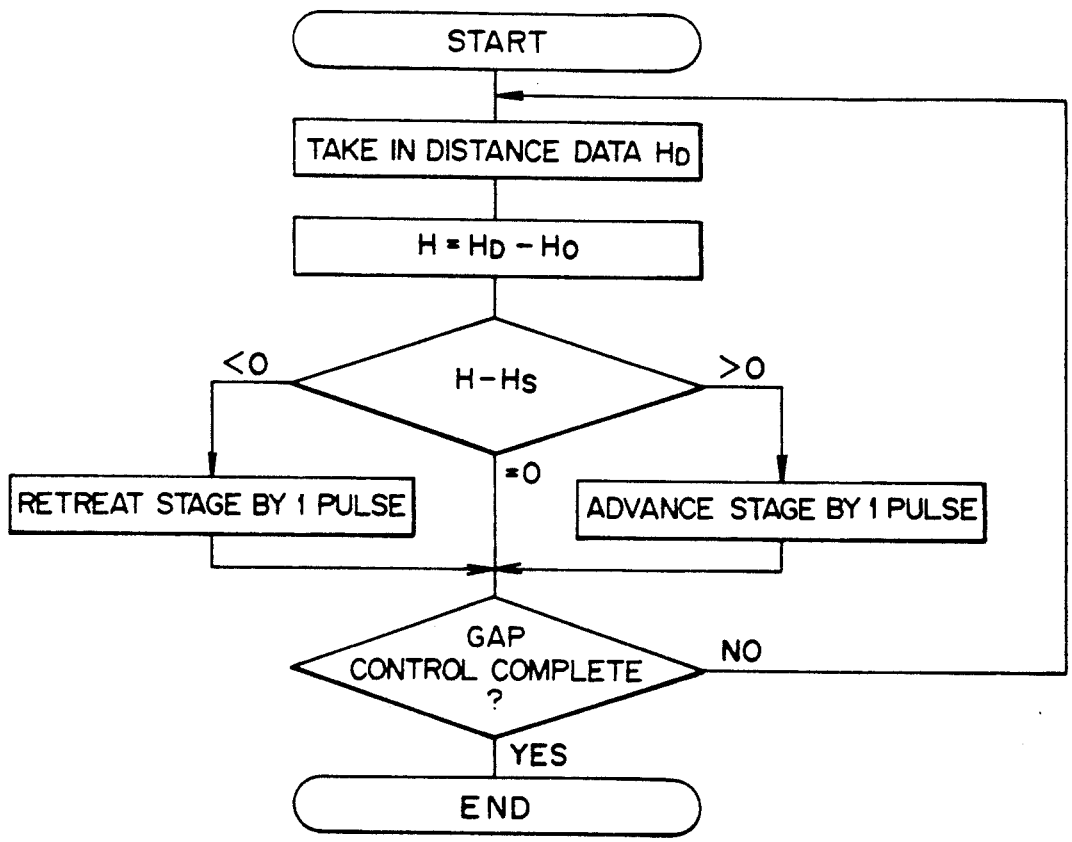
FIG. 11 is a flow chart of a distance control program for explaining control of the distance between a measuring electrode and a photosensitive substance.

FIG. 11 is a chart for explaining an embodiment of distance control between the measuring electrode 3a and the photosensitive substance 6, and shows the flow of a distance control program.

Distance data $H_D$ of the sum or the mean value of distance which can be measured by the distance sensors 1 are loaded and the difference between the distance data $H_D$ and the distance data $H_O$ of the photosensitive substance 6 is obtained, to thereby compute the distance $H (= H_D - H_O)$ between the measuring electrode 3a and the photosensitive substance 6. Then, the precision pulse stage 5 advances or withdraws so that the distance H becomes equal to a distance set value H.

Figure 12:
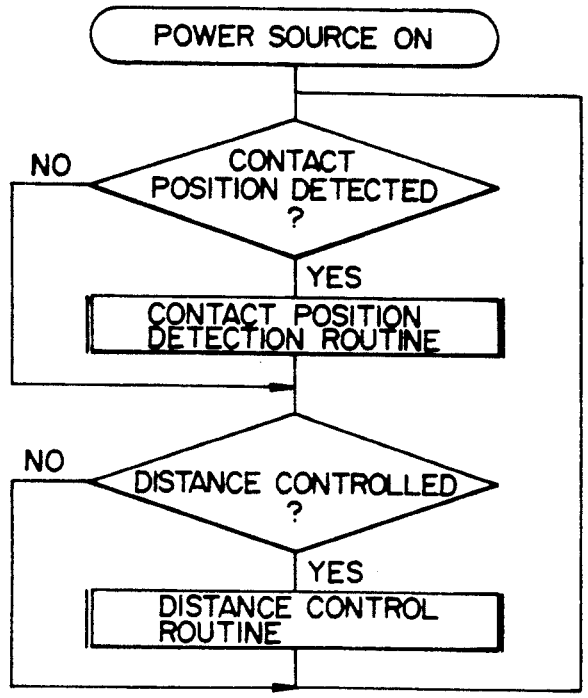
FIG. 12 is a flow chart of a precision pulse stage control program including contact position measurement and distance control between a measuring electrode and a photosensitive substance.

FIG. 12 shows an embodiment of the entire control program of the precision pulse stage 5 including measurement of the contact position and control of the distance between the measuring electrode 3a and the photosensitive substance 6, and is a chart showing the flow of the program.

Figure 13:
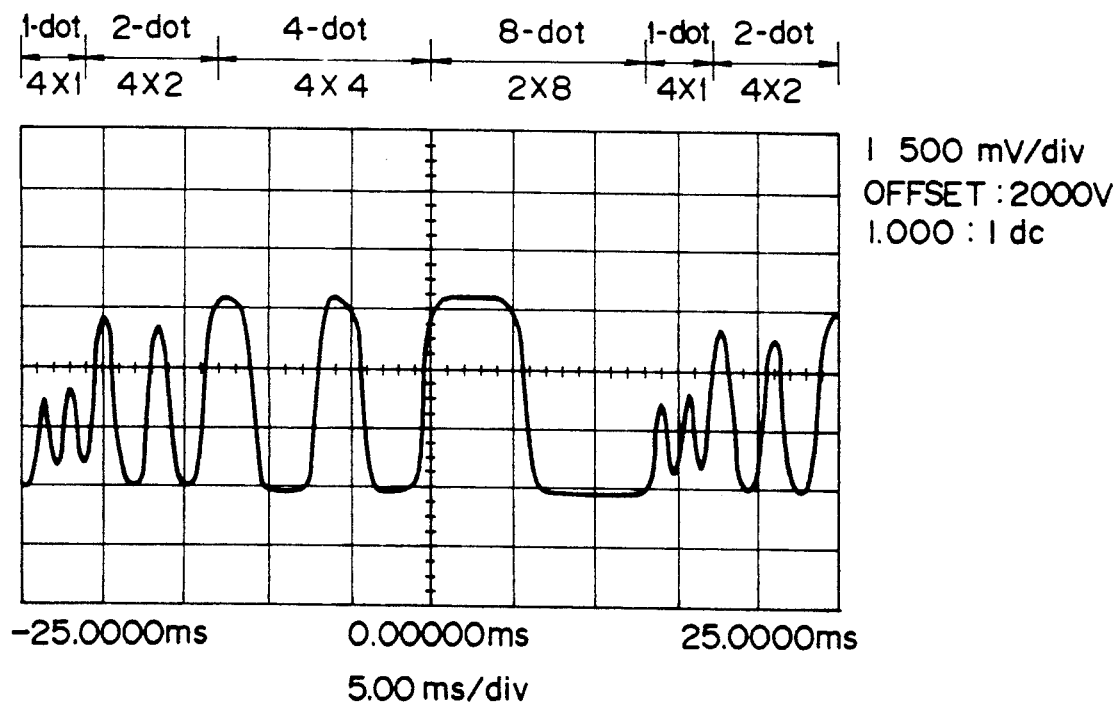
FIG. 13 is a graphical illustration of a result of measuring an electrostatic latent image of an electrostatic recorder.

FIG. 13 shows the result of measurement of an electrostatic latent image formed on the photosensitive substance 6. Also, FIG. 13 shows the result of the measurement of the actual electrostatic latent image by forming an exposure pattern having the resolution of 300 dpi (dot per inch) using the electrostatic latent image measurement instrument. The horizontal axis represents a time (5 microsecond/section) indicating a movement of the photosensitive substance 6. The vertical axis represents an electric potential (0.5 v/section) measured by the instrument. It is noted that the accurate measurement is repeated by twice of each exposure and non-exposure in the order of one-dot, two-dot and four-dot from the left-end of the graph, and also, by once of each exposure and non-exposure for eight-dots, again one-dot then two-dots as shown in FIG. 13. This is the result of exposing an organic photosensitive substance with an LED, and the exposed pattern is a repetition of "8 dots exposure—8 dots non-exposure—4 dots exposure—4 dots non-exposure—4 dots exposure —4 dots non-exposure—2 dots exposure—2 dots nonexposure —2 dots exposure—2 dots non-exposure—1 dot exposure—1 dot non-exposure—1 dot exposure—1 dot non-exposure".

Figure 14:
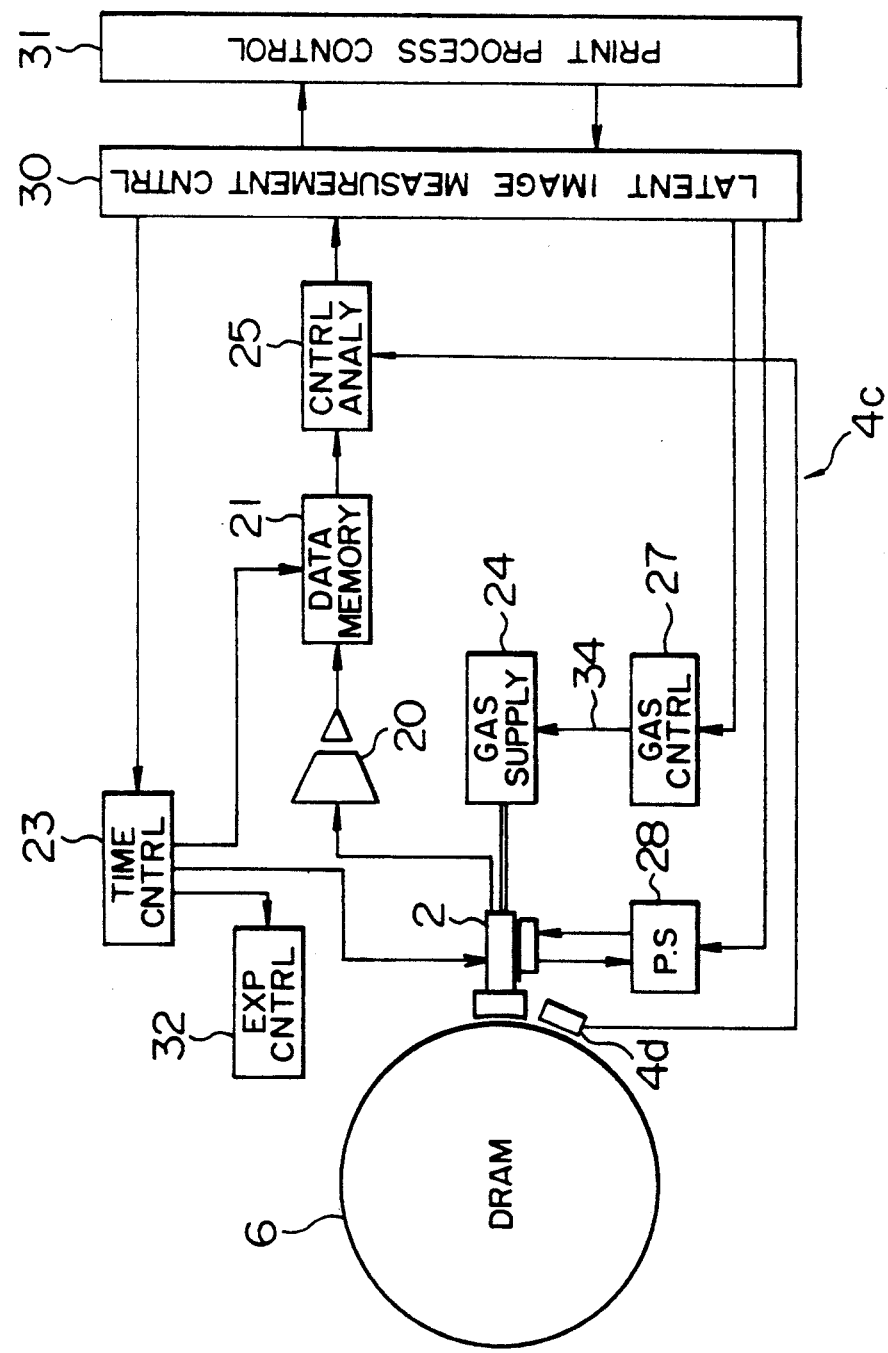
FIG. 14 is a schematic view of a control circuit construction of an electrostatic recorder in which an electrostatic latent image measuring instrument is incorporated.

FIG. 14 is a block diagram of a control circuit of an electrostatic recorder in which the electrostatic latent image measuring instrument 4c is incorporated.

To the electrostatic latent image measuring instrument 4c, a precision pulse stage control unit 28, a gas supply/exhaust mechanism portion 24, a gas supply/exhaust control unit 27 and a timing control unit 26 are connected, and control of latent image measuring operation is carried out.

An output signal of the probe 2 is transmitted to the data storage means 21 through an insulation amplifier 20 to send a waveform data to data analyzing means 25.

The operation of the precision pulse stage control unit 28 for controlling the pulse stage means, the gas supply/exhaust control unit 27 for controlling start and stop of the gas supply and the timing control unit 23 indicating the timing control of the respective circuits is made by an electrostatic latent image measurement control unit 30, and the result of analysis by the data analyzing means 25 is supplied to the electrostatic latent image measurement control unit 30 and then supplied to a process control unit 31 of the electrostatic recorder as control information. An exposure control unit 32 carries out ordinary exposure operations based on an exposure control signal from the timing control unit 23. A line from the timing control unit 23 to the probe 2 corresponds to the line via photocoupler (P.C. as shown in FIG. 7. Also, a surface potential measuring unit 4d is arranged on the surface of the photosensitive substance 6 so as to measure it an absolute value of an electric potential on the entire surface thereof.

Figure 15:
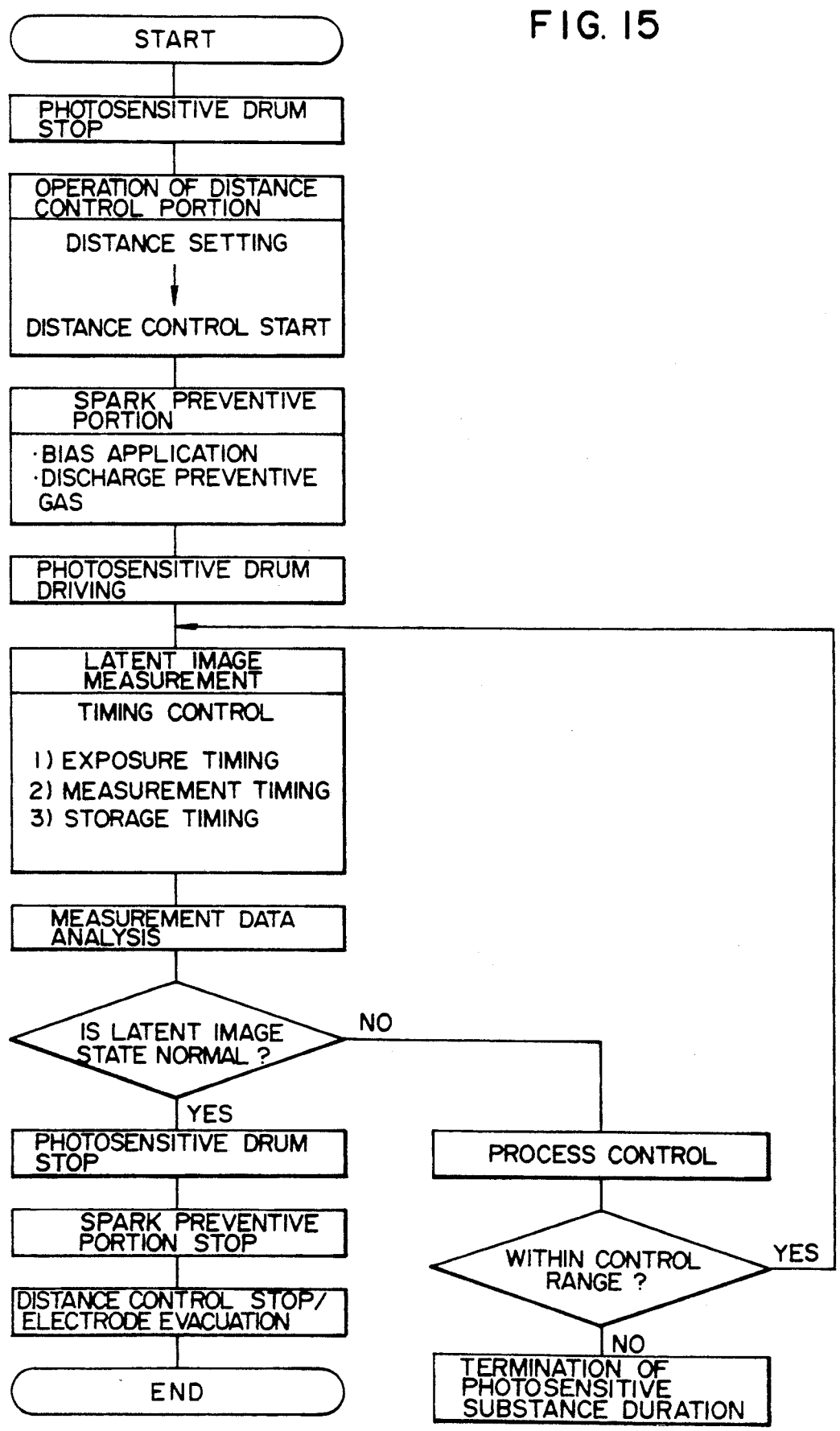
FIG. 15 is a flow chart of latent image measurement and device control of an electrostatic recorder in which an electrostatic latent image measuring instrument is incorporated.

FIG. 15 is a flow chart showing latent image measurement and device control of an electrostatic recorder in which the electrostatic latent image measuring instrument 4c is incorporated.

First, a photosensitive drum of the electrostatic recorder is stopped, and the distance between the measuring electrode 3a and the photosensitive substance 6 is set, thus conducting measurement gap control. Next, an arc preventive portion with a gas having a high arc starting voltage or a common potential as a reference power source voltage is operated. The electrostatic recorder is started, and exposure of diagnosis exposure pattern from an exposure system, switching of the mode of the probe 2 of an electrostatic latent image from an arc state to a measurement state, and loading of measurement data to the data storage means 21 are controlled by three timing signals of the timing control unit 26. The measurement data stored in the data storage means 21 are analyzed by the data analyzing means 25, thus controlling exposure, exposure time, development bias, photosensitive substance heater and the like.

Measurement and control are repeated until the result of analysis of the latent image state becomes normal. Further, when normal latent image measurement results are unobtainable even if control range of operation of the printing process is exceeded, the life of the photosensitive substance is determined.

When the latent image state becomes normal, the photosensitive drum is stopped, the operation of the arc preventive portion is stopped, distance control is stopped, and the measuring electrode 3a is withdrawn from the vicinity of the photosensitive substance 6, thus completing a series of latent image measurement and instrument state setting operation.

Further, when the distance is preset, it is also possible to perform control of a printing process without stopping the printing operation of the electrostatic recorder by providing an exposure location for measurement and control at a part of the photosensitive substance during printing.

The above-mentioned embodiment is one related to an electrostatic recorder when the electrostatic latent image 4c shown in above-mentioned embodiment is used, and the operation and the construction described above may be simplified depending on the construction and the performance of the electrostatic latent image measuring instrument 4c.

Figure 16A:
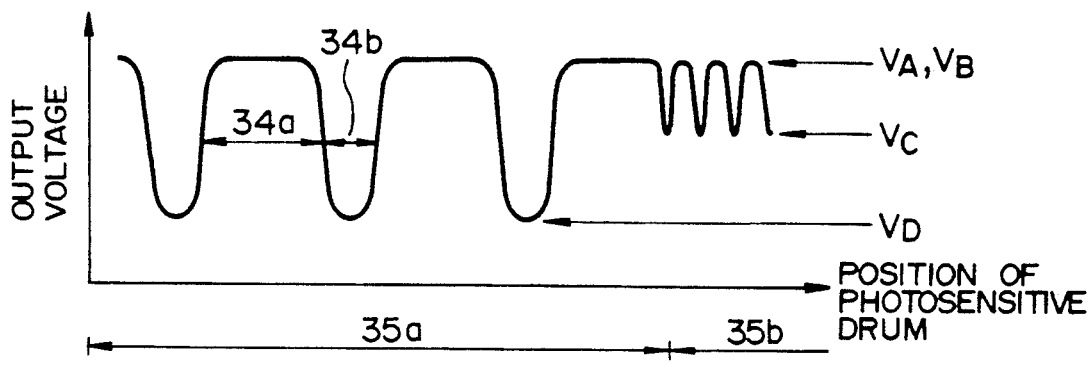
FIG. 16A, FIG. 16B and FIG. 16C are graphical illustration of measuring electrostatic latent images formed on a photosensitive substance by repetition of exposure and non-exposure for every several dots and repetition of exposure and non-exposure for every dot.
Figure 16B:
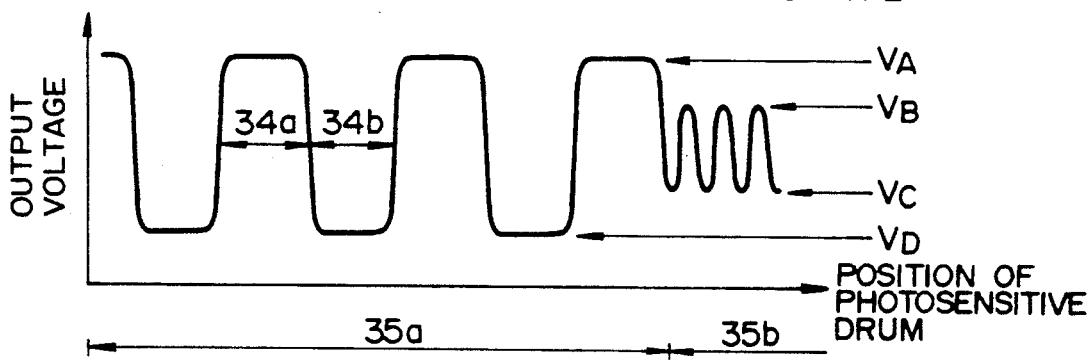
Figure 16C:
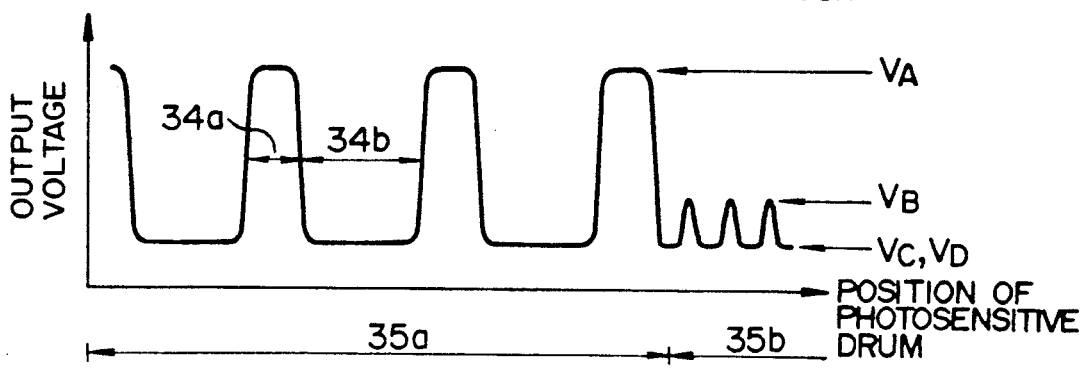

FIG. 16A, FIG. 6B, FIG. 16C and FIG. 17 are graphical illustrations for explaining a control technique of the exposure system and the development system by an electrostatic latent image with FIG. 16A depicting a characteristic when the exposure or the exposure time is little, FIG. 16B depicting a characteristic when the exposure or the exposure time is appropriate, and FIG. 16C depicting a characteristic when the exposure or the exposure time is greater.

FIG. 16A, FIG. 16B and FIG. 16C show the results of measuring the latent images formed on the photosensitive substance 6 by a latent image portion 35a in which repetition interval of exposure and non-exposure is wide for every several dots is long and a latent image portion 35b in which repetition interval of exposure and non-exposure for every dot is narrow. The electrostatic latent image varies against the variation of the exposure or the exposure time as shown in FIG. 16A, FIG. 16B and FIG. 16C. In order to obtain a beautiful picture image at this time, it is only necessary to perform a control operation so that the width 34b of the latent image at the exposure position and the width 34a of the latent image at the non-exposure position are identical with each other as shown in FIG. 16B.

Further, it is also possible to obtain absolute potentials at respective parts of the latent image by using both the electrostatic latent image measuring instrument 4c and a surface potential measuring means at the same time. In the photosensitive substance 6, potentials $V_{RA}$ and $V_{RD}$ in the exposure region and the non-exposure region, measured by the surface potential measuring means, correspond to the positions of output voltages $V_A$ and $V_D$ of the latent image portion 35a having sufficiently wide exposure width of the electrostatic latent image measuring instrument 4c shown in FIG. 16A, FIG. 16B and FIG. 16C. The practical maximum potential $V_{RB}$ and minimum potential $V_{RC}$ in the latent image portion 35b formed by an exposure pattern having a narrow latent image width are obtainable with following equations from output voltages $V_A$, $V_B$, $V_C$ and $V_D$ of the electrostatic latent image measuring instrument 4c and measured voltages $V_{RA}$ and $V_{RD}$ by the surface potential measuring means.

$$V_{RB} = \frac{(V_B - V_D)}{(V_A - V_D)} \cdot (V_{RA} - V_{RD}) - V_{RD} \quad (1)$$

$$V_{RC} = \frac{(V_C - V_D)}{(V_A - V_D)} \cdot (V_{RA} - V_{RD}) - V_{RD} \quad (2)$$

Figure 17:
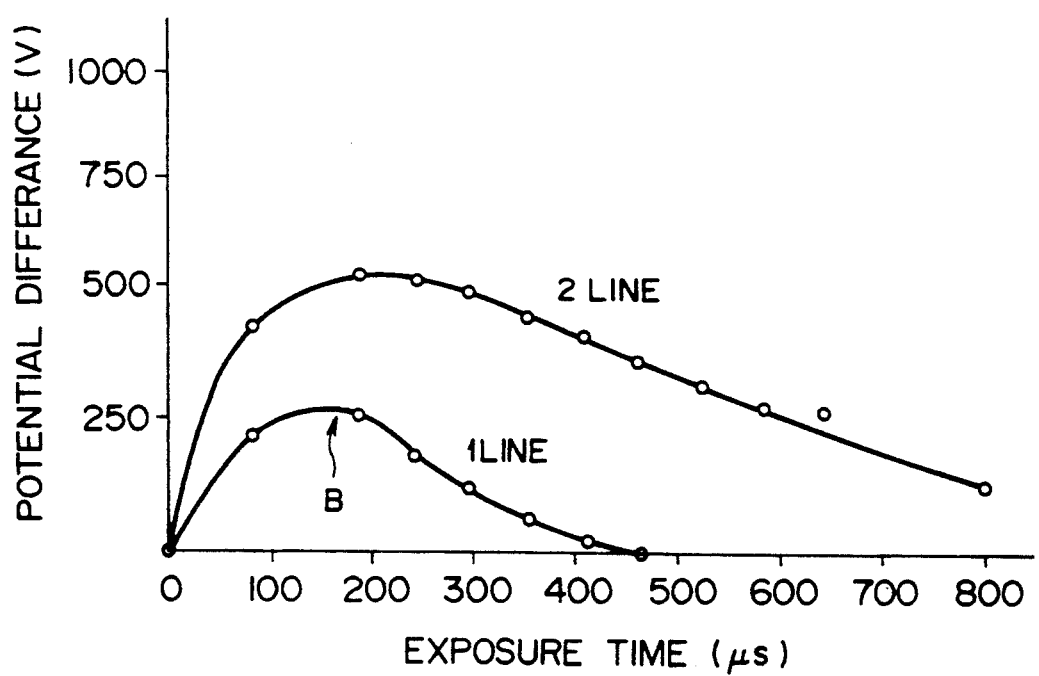
FIG. 17 is a graphical illustration of computing contrast potentials in a repetition pattern portion of exposure and non-exposure for every dot or every two dots.

FIG. 17 shows results of computing contrast potential (difference between the maximal potential and the minimal potential) in the latent image portions 35a and 35b by repetition of exposure and non-exposure for every dot or every two dots by above-mentioned operation utilizing the equations (1) and (2).

In order to form a beautiful picture image, it is only necessary that the exposure or the exposure time takes a position shown at "B" where the potential difference in the exposure pattern for every dot is maximized.

The above-described embodiment shows a case in which the electrostatic latent image measuring instrument 4c detects an electrostatic latent image on the photosensitive substance 6 as a relative variation of a photosensitive substance surface potential and an exposure. When the electrostatic latent image measuring instrument 4c is able to detect an electrostatic latent image on the photosensitive substance 6 as absolute value variation of the photosensitive substance surface voltage, absolute voltage value conversion for respective parts of the latent image by computation based on the equations (1) and (2) is not necessary, and also only the electrostatic latent image measuring instrument 4c (high precision surface potential measuring means) is required as the measuring means of the electrostatic latent image.

In case of an inversion phenomenon such as a printer, a fine line turns black if the development bias is over the maximum potential $V_{RB}$ indicated by the output voltage $V_B$ in FIG. 16A, FIG. 16B and FIG. 16C. Further, a fine line is not developed when the development bias is at the minimal potential $V_{RC}$ and below indicated by the output voltage $V_C$ in FIG. 16A, FIG. 16B and FIG. 16C. It is possible to develop the electrostatic latent image of a picture to an extent of a fine line by setting the development bias at a potential between the maximum potential $V_{RB}$ and the minimum potential $V_{RC}$ of the fine line, and the picture image may be formed most beautifully at a potential near the middle of the maximum potential $V_{RB}$ and the minimum potential $V_{RC}$. By controlling the development bias so as to approach the middle of the maximum potential $V_{RB}$ and the maximum potential $V_{RC}$ of the electrostatic latent image of a fine line, it is possible to perform a stabilized development also for the type and elapsed variation of the photosensitive substance 6.

It has been known that a Si-photosensitive substance and the like produce an image flowing of a latent image depending on humidity or temperature. Since it is possible to determine a state of an electrostatic latent image on the photosensitive substance 6 by using the electrostatic latent image measuring instrument 4c, it is also possible to control operation stop of a heater and the like of the photosensitive substance 6.

Further, since it is possible to know a state of an electrostatic latent image on the photosensitive substance 6 by using the electrostatic latent image measuring instrument 4c, it is possible to determine the life of the photosensitive substance 6. In practice, it may be determined that the life of the photosensitive substance 6 has been exhausted when a sufficient potential difference cannot be applied to the latent image of a fine line within the control range of the exposure system, when the control range of the development bias is off state between the maximum potential $V_{RB}$ and the minimum potential $V_{RC}$ of the fine line and so forth.

In case of the photosensitive substance 6 such as a Si-photosensitive substance in which a latent image produces image flowing depending on humidity and temperature, the above-described life determination may be made after prescribed temperature and humidity or the heater of the photosensitive substance 6 are operated for a sufficient period of time.

As explained above, it is possible to measure the latent image state on the photosensitive substance 6 by using an electrostatic latent image measuring instrument in an electrostatic recorder. Thus, it is possible to control a printing process related to latent image formation such as exposure, exposure time, development bias and heater for photosensitive substance under optimum conditions.

Since means for maintaining a constant distance between the measuring electrode 3a and the photosensitive substance 6 is provided, the electrostatic latent image can be measured even if eccentricity is produced in a photosensitive substance 6. Further, it is possible to control the distance of the measuring electrode 3a portion by a plurality of distance sensors 1.

Furthermore, it is possible to prevent an arcing between the measuring electrode 3a and the photosensitive substance 6 by setting the common potential of the probe 2 at an intermediate potential between the maximum potential and the minimum potential of the photosensitive substance 6. Further, it is possible to prevent arcing between the measuring electrode 3a and the photosensitive substance 6 by providing means for accommodating a gas having a high arc starting voltage between the measuring electrode 3a and the photosensitive substance 6.

It is possible to reduce a plunging current at the time of switch change-over and a leakage current at the time of measurement so as to measure an electrostatic latent image stably by constructing a discharge switch 11 of the probe 2 as shown in FIG. 3.

It is also possible to measure an electrostatic latent image without having noises caused by vibration at the time of measuring an electrostatic latent image by supporting the probe 2 with a vibration absorbing member.

In the above-described embodiments, SF$_6$ gas is used for reducing the electrostatic arc, but a dry air or a dry N$_2$ gas can be used as well.

What is claimed is:

1. An electrostatic recorder comprising:
   a print process control means having an electrostatic charge means for uniformly charging a surface of a photosensitive substance;
   exposure means for exposing and forming an electrostatic latent image on the surface of said photosensitive substance;
   development means for forming a visible image;
   transferring means for transferring said visible image onto a paper;
   an electrostatic latent image measuring unit for measuring a state of electrostatic latent image formed on the surface of said photosensitive substance, said electrostatic latent image measuring unit including distance control means for maintaining a predetermined distance between said electrostatic latent image measuring unit and said photosensitive substance when measuring the state of the electrostatic latent image, and
   wherein said print process control means controls at least one portion of printing process in dependence upon a measurement result of the electrostatic latent image measuring unit.

2. An electrostatic recorder according to claim 1, wherein control factors related to the printing process include at least exposure, exposure time, electrostatic charge voltage, development bias, transfer voltage, temperature, humidity.

3. An electrostatic recorder according to claim 1, wherein said print process control means controls temperature and humidity of said photosensitive substance until the results of measurement of said electrostatic latent image measured by aid electrostatic latent image measuring unit indicate a predetermined temperature and humidity.

4. An electrostatic recorder according to claim 1, wherein said electrostatic latent image measuring unit relatively detects electric potential variation on the surface of said photosensitive substance and electric charge quantity variation of said electrostatic latent image while said electrostatic latent image measuring unit is being held at the predetermined distance.

5. An electrostatic recorder according to claim 4, wherein said electrostatic latent image measuring unit includes a surface potential measuring unit for measuring an absolute value of an electric potential in a relatively wide area of several dotted pattern along the surface of said photosensitive substance in revolving direction.

6. An electrostatic recorder according to claim 5, wherein said surface potential measuring unit determines a difference V between an electric potential on the entire surface of said photosensitive substance at time of both the exposure and non-exposure; said electrostatic latent image measuring unit determines a difference W between the maximum and minimum values of output voltages measured from every several dotted pattern through several tens of dotted pattern including variation of electric charge quantity or electric potential of said electrostatic latent image, formed by exposure, along the surface of said photosensitive substance in revolving direction, and determines a difference S between the maximum and minimum values of output voltages measured from every single dotted pattern of said electrostatic latent image including variation of electric charge quantity or electric potential; and said print process control means adjusts at least one of exposure and exposure time so that the value of V×S/W becomes the maximum thereof.

7. An electrostatic recorder according to claim 5, wherein said surface potential measuring unit determines difference V between an electric potential on the whole surface of said photosensitive substance at time of both the exposure and non-exposure; said electrostatic latent image measuring unit determines a difference W between the maximum and minimum values of output voltages measured from every several dotted pattern through several tens of dotted patterns including variation of electric charge quantity or electric potential of said electrostatic latent image, formed by exposure, along the surface of said photosensitive substance in a revolving direction, and determines a difference S between the maximum and minimum values of output voltages measured from every single dotted pattern including variation of electric charge quantity or electric potential of said electrostatic latent image; and said control means adjusts temperature and humidity of said photosensitive substance until the value of V×S/W reaches a threshold value.

8. An electrostatic recorder according to claim 5, wherein said surface potential measuring unit determines an electric potential of the entire surface of said photosensitive substance at the time of both the exposure and non-exposure; said electrostatic latent image measuring unit determines the maximum and minimum values of output voltages measured from both every several dotted pattern through several tens of dotted patterns and every single dotted pattern including variation of electric charge quantity or electric potential of said electrostatic latent image, formed by exposure, along the surface of said photosensitive substance in a revolving direction; said surface potential measuring unit determines a maximum potential $V_{1H}$ and a minimum potential $V_{1L}$ of every single dotted pattern of said electrostatic latent image based on the maximum and minimum valves determined from said electrostatic latent image measuring unit, respectively; and said print process control means controls a development bias so as to become less than the maximum potential $V_{1H}$ and larger than the minimum potential $V_{1L}$.

9. An electrostatic recorder according to claim 5, wherein said surface potential measuring unit determines a difference V between an electric potential on the entire surface of said photosensitive substance at time of both the exposure and non-exposure; and said electrostatic latent image measuring unit determines a difference W between the maximum and minimum values of output voltages measured from every several dotted pattern through several tens of dotted patterns including a variation of electric charge quantity or electric potential of said electrostatic latent image, formed by exposure, along the surface of said photosensitive substance in revolving direction, determines a difference S between maximum and minimum values of output voltages measured from every single dotted pattern including variation of electric charge quantity or electric potential of said electrostatic latent image, and generates a replacement signal for replacing said photosensitive substance when the value of $V \times S/W$ is equal to or less than a theshold value.

10. An electrostatic recorder according to claim 5, wherein said print process control means measures at least one of operation time, temperature and humidity of said photosensitive substance; said surface potential measuring unit determines a difference V between an electric potential on the whole surface of said photosensitive substance at the time of both the exposure and non-exposure when the measured value by said print process control means is present in a predetermined range; and said electrostatic latent image measuring unit determines a difference W between the maximum and minimum values of output voltages measured from every several dotted pattern through several tens of dotted patterns including a variation of electric charge quantity or electric potential of said electrostatic latent image, formed by exposure, along the surface of said photosensitive substance in revolving direction, determines a difference S between maximum and minimum values of output voltages measured from every single dotted pattern including variation of electric charge quantity or electric potential of said electrostatic latent image, and generates a replacement signal for replacing said photosensitive substance when the value of $V \times S/W$ is equal to or less than a theshold value.

11. An electrostatic recorder according to claim 4, wherein said electrostatic latent image measuring unit includes a surface potential measuring unit for measuring an absolute value of the photosensitive surface voltage of said electrostatic latent image formed on the surface of said photosensitive substance.

12. An electrostatic recorder according to claim 11, wherein said electrostatic latent image measuring unit determines a contrast potential indicative of a difference between maximum and minimum potential portions of output voltages measured from every single dotted pattern including variation of electric charge quantity or electric potential of said electrostatic latent image, formed by exposure, along the surface of said photosensitive substance a revolving direction; and said print process control means adjusts at least one of exposure and exposure time so that said contrast potential becomes the maximum.

13. An electrostatic recorder according to claim 11, wherein said electrostatic latent image measuring unit determines a contrast potential indicative of a difference between maximum and minimum potential portions of output voltages measured from every single dotted pattern including variation of electric charge quantity or electric potential of said electrostatic latent image, formed by exposure, along the surface of said photosensitive substance a revolving direction; and said print process control means adjusts temperature and humidity of said photosensitive substance so that said contrast potential becomes larger than a threshold value.

14. An electrostatic recorder according to claim 11, wherein said electrostatic latent image measuring unit measures a maximum potential $V_{1H}$ and a minimum potential $V_{1L}$ from every single dotted pattern including variation of electric charge quantity or electric potential of said electrostatic latent image, formed by exposure, along the surface of said photosensitive substance in a revolving direction; and said print process control means adjusts a development bias so as to be less than the maximum potential $V_{1H}$ or larger than the minimum potential $V_{1L}$.

15. An electrostatic recorder according to claim 11, wherein said electrostatic latent image measuring unit determines a contrast potential indicative of a difference between maximum and minimum potential portions of output voltages measured from every single dotted pattern including variation of electric charge quantity or electric potential of said electrostatic latent image, formed by exposure, along the surface of said photosensitive substance in a revolving direction, and generates a replacement signal for replacing said photosensitive substance when said contrast potential is equal to or less than a threshold value.

16. An electrostatic recorder according to claim 11, wherein said print process control means adjusts temperature and humidity of said photosensitive substance; and said electrostatic latent image measuring unit determines a contrast potential indicative of a difference between the maximum and minimum potential portion of output voltages measured from every single dotted pattern including variation of electric charge quantity or electric potential of said electrostatic latent image, formed by exposure, along the surface of said photosensitive substance in a revolving direction, and generates a replacement signal for replacing said photosensitive substance when said contrast potential is equal to or less than a threshold value.

17. An electrostatic recorder according to claim 1, wherein said print process control means include exposure means, data storage means for storing measurement data of having electric charge quantity or electric potential of said electrostatic latent image, data analyzing means connected to said data storage means for analyzing measurement data, and timing control means for generating a timing signal to indicate operation of said respective means, whereby said exposure means is operated by the timing signal, said electrostatic latent image measuring unit is operated so as to measure the electric charge quantity or electric potential of the electrostatic latent image, the measured data are temporarily stored in said data storage means, the measured data are analyzed by said data analyzing means, and control factors related to the printing process are adjusted until the electrostatic latent image is transferred to the paper based on the result of the analysis.

18. An electrostatic recording according to claim 1, wherein said electrostatic latent image measuring unit includes an electrostatic latent image measuring sensor portion maintained in a position spaced from the surface of said photosensitive substance by a distance greater than an eccentric quantity of said photosensitive substance at a time of non-measurement of the electrostatic latent image, while maintained near the surface of said photosensitive substance by a predetermined distance at a time of measurement of the electrostatic latent image, thereby maintaining a constant distance therebetween.

19. An electrostatic recorder comprising:
a print process control means having electrostatic charge means for uniformly charging a surface of a photosensitive substance;
exposure means for exposing and forming an electrostatic latent image on the surface of said photosensitive substance;
development means for forming a visible image;
transfer means for transferring said visible image onto a paper;
an electrostatic latent image measuring unit for measuring variation of a part of an electric charge quantity formed by a single exposure scanning operation on the surface of the photosensitive substance, said electrostatic latent image measuring unit including distance control means for maintaining a predetermined distance between said electrostatic latent image measuring unit and said photosensitive substance when measuring the state of the electrostatic latent image; and
wherein said print process control means controls at least one portion of a printing process in dependence upon a measurement result of the electrostatic latent image.

20. An electrostatic recorder for uniformly charging a surface of a photosensitive substance by electrostatic charge means, carried out by exposure by exposure means, forming an electrostatic latent image on the surface of said photosensitive substance, forming a visible image by development means, and transferring said visible image onto a paper by transfer means, comprising:
an electrostatic latent image measuring unit for measuring a state of an electrostatic latent image formed on the surface of said photosensitive substance; and
control means for varying control factors related to a printing process from an electrostatic charge on the surface of said photosensitive substance by said electrostatic charge means to transfer the visible image onto the blank by the transfer means in accordance with results of a measurement of the electrostatic latent image, and
wherein said electrostatic latent image measuring unit measures variation of electric charge quantity or electric potential from every repetitive dotted pattern of the electrostatic latent image, formed by exposure, along the surface of said photosensitive substance in a revolving direction.

21. An electrostatic recorder according to claim 20, wherein said electrostatic latent image measuring unit measures at least one of a variation of electric charge quantity or electric potential from every several dotted pattern through several tens dotted pattern and every single dotted pattern of said electrostatic latent image, both along the surface of said photosensitive substance in revolving direction.

22. An electrostatic recorder according to claim 21, wherein said electrostatic latent image measuring unit determines a difference W between maximum and minimum values of output voltages measured from every several dotted pattern through several tens dotted pattern including variation of electric charge quantity or electric potential of said electrostatic latent image, formed by exposure, along the surface of said photosensitive substance in revolving direction, determines a difference S between the maximum and minimum values of output voltages measured from every single dotted pattern including variation of electric charge quantity or electric potential of said electrostatic latent image, and generates a replacement signal for replacing said photosensitive substance when the value of S/W is less than a threshold value.

23. An electrostatic recorder according to claim 21, wherein said print process control means measures at least one of operation time, temperature and humidity of said photosensitive substance, and, when the measured value is present in a predetermined range, said electrostatic latent image measuring unit determines a difference W between maximum and minimum values of output voltages measured from every several dotted pattern through several tens of dotted patterns including variation of electric charge quantity or electric potential of said electrostatic latent image, formed by exposure, along the surface of said photosensitive substance in revolving direction, determines a difference S between the maximum and minimum values of output voltages measured from every single dotted pattern including variation of electric charge quantity or electric potential of said electrostatic latent image, and generates a replacement signal for replacing said photosensitive substance when the value of S/W is less than a threshold value.

24. An electrostatic recorder according to claim 20, wherein said control means controls one of the exposure or the exposure time of an exposure portion of every repetitive dotted pattern including variation of electric charge quantity or electric potential of said electrostatic latent image, formed by exposure, along the surface of said photosensitive substance in revolving direction so that each of the distances between said exposure portion and a non-exposure portion of said electrostatic latent image actually formed on said photosensitive substance is identical.

* * * * *